Nov. 21, 1961 A. H. STORY 3,010,016

REMOTE TUNING RADIO RECEIVER

Filed Jan. 20, 1958

INVENTOR.
Allan H. Story
BY Mueller & Aichele
Attys.

3,010,016
REMOTE TUNING RADIO RECEIVER
Allan H. Story, Lincolnwood, Ill., assignor to Motorola, Inc., Chicago, Ill., a corporation of Illinois
Filed Jan. 20, 1958, Ser. No. 710,020
3 Claims. (Cl. 250—20)

Figures 1, 2:
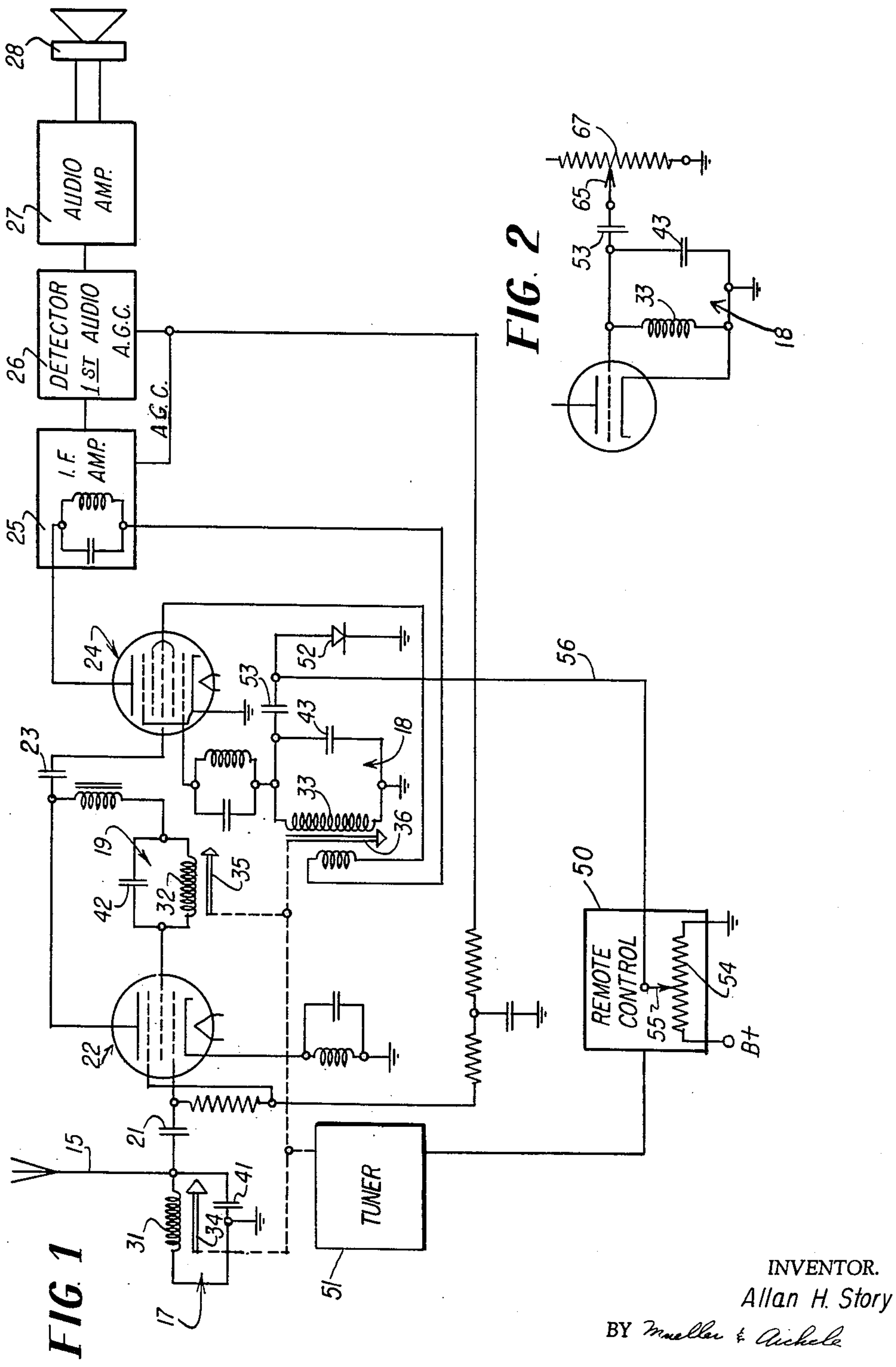

This invention relates generally to tuning systems for radio receivers, and more particularly to a remotely controlled circuit for providing vernier tuning of a trunk-mounted automobile radio receiver.

Although in most radio receivers now being manufactured the controls are provided in the same housing with the rest of the receiver, in certain applications it is desirable to separate the controls from the receiver proper. For instance, automobile radio receivers may be mounted in the trunk of the automobile because of space and appearance considerations, and then the controls must be located near the driver, usually on the dashboard of the automobile. The provision of remote controls for the tuning system of a trunk-mounted automobile radio receiver involves several problems which the known remote controlled tuning systems have not completely solved. For example, some require the use of expensive shielded cables, some are bulky and/or complicated, and some do not provide sufficiently accurate tuning.

It is an object of this invention to provide a new and improved remote controlled tuning system for a radio receiver.

Another object of the invention is to provide an improved trunk-mounted automobile radio receiver having a vernier tuning circuit which is remotely controlled with direct current.

Still another object of the invention is to provide a permeability tuned radio receiver with an improved vernier remote tuning circuit for adjusting the tuning of an oscillator in the receiver from a distant point.

A feature of the invention is the provision of an improved radio receiver having a parallel tuned circuit including a series resistance-capacitance branch so that the resonant frequency of the tuned circuit can be varied by changing the value of the resistance element.

A further feature of the invention is the provision of an improved parallel resonant circuit for use in providing tuning of a radio receiver and including a series connected diode and capacitor branch coupled to a coil and capacitor loop, whereby the resonant frequency may be varied by applying different direct current biasing potentials to the diode. This frequency variation can be readily accomplished from a remote point by providing a direct current carrying conductor leading from the diode to a potentiometer located at the remote point.

A still further feature of the invention is the provision of an improved trunk-mounted automobile radio receiver having a permeability tuning system for providing approximate or zone tuning and having an oscillator including a semiconductor diode supplied with direct current bias potential at a level controlled by a potentiometer which is mounted on the dashboard of the automobile, whereby remote vernier tuning for the oscillator is accomplished by varying the potentiometer setting.

The invention is illustrated in the drawings in which:

FIG. 1 is a circuit diagram of a radio receiver having a remote vernier tuning system in accordance with the invention; and FIG. 2 is a circuit diagram showing a simplified equivalent circuit for the vernier tuning system of FIG. 1.

The invention consists of a remote controlled tuning circuit which is especially suitable for providing vernier tuning of a trunk-mounted automobile radio receiver from a control point located on the dashboard of the automobile. The receiver is provided with a plurality of tuned circuits each including variable permeability inductors, and the frequency of the wave signals received by and passed through the receiver is controlled by adjusting the position of the cores of the inductors. One tuned circuit which controls the frequency of oscillator signals used in providing heterodyning action is provided with a semiconductor diode and a capacitor connected in series to form a branch thereof. The diode is supplied with biasing potential at a level controlled by a potentiometer which is mounted on the dashboard of the automobile, and the diode is biased for conduction so that its effective resistance is voltage sensitive. The resonant frequency of the oscillator tuned circuit is therefore controlled by the level of the biasing potential for the diode so that vernier remote tuning is accomplished merely by adjusting the potentiometer.

In FIG. 1 there is shown part of the circuit for a radio receiver adapted to be installed in the trunk of an automobile and remotely controlled. The antenna 15 picks up radio frequency signals which are applied to the radio frequency amplifier stage 22 by the capacitor 21. The frequency of the signals applied to the radio frequency amplifier stage 22 is controlled by the tuned circuit 17 including an inductor 31 and a capacitor 41 connected in parallel, and the frequency of the output of the radio frequency amplifier stage 22 is controlled by the tuned circuit 19 including an inductor 32 and a capacitor 42 connected in parallel. The amplified signals are applied by the capacitor 23 to the converter stage 24 where the signals are heterodyned and converted to an intermediate frequency. The frequency of the oscillator signal utilized in the heterodyning action is controlled by the tuned circuit 18 including an inductor 33 and a capacitor 43 connected in parallel. The heterodyned signals are applied to an intermediate frequency amplifier stage 25. The audio frequency component of the signals is detected in a detector stage and is amplified by an audio frequency amplifier stage, and these stages along with an automatic gain control circuit are represented by the block 26 since all of them are connected to a single tube. The resulting audio frequency signal is then further amplified in the power amplifier stage 27 and is applied to a loudspeaker 28 which converts the signal to sound energy.

The resonant frequency of each of the tuned circuits 17, 18 and 19 is controlled respectively by varying the permeability of the inductors 31, 32 and 33 included therein. This is accomplished by the tuner 51 which moves the cores 34, 35 and 36 in the embodiment shown in FIG. 1. The tuner 51 is a signal seeking search tuner which may be any of several well-known constructions and therefore is not shown in detail. A motor driven signal seeking tuner, which is actuated in a selected direction by start pushbuttons or other controls located in the control unit 50 on the dashboard of the vehicle, has been used satisfactorily.

A listener may use the search tuner 51 in the conventional manner to select a desired station. Frequently, however, the listener wishes to tune in another station in the same frequency zone as the one he is presently listening to. The tuned circuits 17 and 19 are tuned rather broadly and will pass a frequency band which may be thought of as a zone. Therefore, stations within this frequency zone may be obtained merely by tuning the oscillator to beat with the desired signal.

Therefore, a remote vernier tuning system is provided to permit adjusting the frequency to which the oscillator is tuned. This is accomplished by providing another capacitor 53 and a diode 52 of the junction type, preferably made of germanium, in the tuned circuit 18. These elements are series connected together, and the capacitor 53 is coupled to the side of the tuned circuit remote from ground while the diode 52 is grounded. Thus, the diode 52 and the capacitor 53 form a branch of the tuned circuit 18 paralleling the loop formed by the inductor 33 and the capacitor 43. Direct current biasing potential of a polarity to bias the diode 52 for conduction is applied through the conductor 56 by the potentiometer 54, which is mounted in the control unit 50 on the dashboard of the vehicle and is connected to the battery-generator direct current voltage source of the automobile. Such electrical systems are nominally rated at 6 or 12 volts and thus provide direct current potential of the order of twelve volts or less.

The setting of the potentiometer 54 is varied to adjust the resonant frequency of the oscillator tuned circuit 18. The slider 55 is moved to change the level of the biasing potential applied to the diode 52. An oscillating voltage is developed across the diode, and the average or integrated value of this voltage varies in response to changes in the biasing potential. Therefore, the diode 52 may be approximately represented as a variable equivalent resistance, and the operation of the vernier tuning may be defined in terms of the simplified circuit shown in FIG. 2 in which a series resistor-capacitor branch is coupled in parallel with the loop formed by the capacitor 43 and the inductor 33. The variable resistor 67 represents the resistance which produces a voltage drop, the average value of which is the same as the average value of the voltage developed across the diode 52 of FIG. 1.

When the slider 65 is adjusted so that the resistor 67 is bypassed, the energy in the branch circuit is all stored in the capacitor 53, and the capacitive reactance in the tuned circuit 18 is the sum of that of capacitors 53 and 43. As the slider 65 is moved up and resistance is introduced into the branch circuit, some of the energy in the branch circuit is dissipated by the resistor 67 and proportionally less is stored by the capacitor 53. Thus, the capacitive reactance of the tuned circuit 18 is reduced, and consequently, its resonant frequency changes. When the slider is moved all the way up, nearly all the energy in the branch circuit is dissipated by the resistor 67 so that the capacitor 53 has little effect on the tuned circuit 18, and the effective capacitive reactance therein is that of capacitor 43. Thus, the simplified circuit shown in FIG. 2 illustrates how the resonant frequency of the tuned circuit 18 shown in FIG. 1 varies according to the setting of the potentiometer 54. It has been found that a frequency shift of about 100 kilocycles at radio frequencies can be obtained effectively in this manner.

Since the potentiometer is small and inexpensive, it makes a very practical control element for dashboard mounting in an automobile. As previously pointed out, the conductor connecting the potentiometer to the tuned circuit need not be shielded since it carries direct current. The tuned circuit itself is very simple and requires only a minimum number of elements in addition to the condenser and coil normally included therein. Although the tuning circuit of the invention has been illustrated as providing remote vernier tuning for a trunk mounted radio receiver, it is clear that it may be used wherever remote tuning is desirable.

I claim:

1. In a radio receiver which is adapted to be mounted in the trunk of an automobile having a battery-generator voltage source providing voltage of the order of twelve volts or less, and a control panel located remotely from the trunk, the combination including antenna means having a first tuned circuit associated therewith, radio frequency amplifier means having a second tuned circuit associated therewith, and oscillator means having a third tuned circuit associated therewith, each of said first, second and third tuned circuit means including variable permeability inductor means, first tuner means operative to vary the permeability of each of said inductor means in unison for setting the resonant frequencies of all of said tuned circuits, and second tuner means including a capacitor, a semiconductor diode series connected to said capacitor, and means connecting said capacitor and diode to said third tuned circuit means in parallel circuit relation therewith, said second tuner means further including potentiometer means connected to said diode means and to the battery-generator of the automobile for applying direct current biasing voltage to said diode in a polarity to bias the same for conduction, with the voltage applied to said diode being no higher than that of the voltage source, said potentiometer means being located on the control panel of the automobile and being manually operable by a driver of the automobile to vary the biasing voltage applied to said diode for varying the effective capacitive reactance of said third tuned circuit, thereby providing remote vernier tuning for the radio receiver.

2. A tuning system for a superheterodyne radio receiver adapted to be mounted in the trunk of an automobile which has a control panel remote from the trunk and an electrical system providing direct current voltage of the order of twelve volts or less, with the radio receiver including an antenna, a radio frequency amplifier stage, and a frequency converting stage including an oscillator portion, said tuning system including in combination, a first resonant circuit connected between the antenna and the radio frequency amplifier stage, a second resonant circuit connected between the radio frequency amplifier stage and the frequency converting stage, and a third resonant circuit connected to the oscillator portion of the frequency converting stage, said first and second resonant circuits being relatively broadly tuned to pass radio signals in a frequency band within a substantially wider frequency range, and said third resonant circuit being relatively sharply tuned to provide selection of signals of particular frequency within such frequency band, said first, second and third resonant circuits each including an inductor having a movable core for varying the tuning thereof, first tuner means including motor driven control means connected to said cores of said inductors and operable to control the position thereof responsive to received radio signals to vary the tuning of said resonant circuits in unison and select a signal of a particular frequency, and second tuner means including a capacitor, a semiconductor diode, means connecting said semiconductor diode and said capacitor in series circuit relation with each other and to said third resonant circuit, and a potentiometer connected to said semiconductor diode and to the electrical system and applying direct current voltage to said diode biasing the same for conduction, with the voltage applied to said diode being no higher than that of the electrical system, said potentiometer being located on the control panel of the vehicle and being manually operable to control the effective capacitive reactance of said third resonant circuit for remotely varying the resonant frequency thereof over a limited frequency range, thereby permitting selection of signals of frequencies within the frequency band passed by said first and second resonant circuits.

3. In radio apparatus for use in an automotive vehicle, and which includes a control unit for mounting at a control point in the vehicle and a receiver unit for mounting at a place in the vehicle remote from the control point, with the receiver unit having an antenna, a radio frequency amplifier stage, and a frequency converting stage including an oscillator portion, a remote tuning system including in combination, a first resonant circuit connected between the antenna and the radio frequency amplifier stage, a second resonant circuit connected between the radio frequency amplifier stage and the frequency converting stage, and a third resonant circuit connected to the oscillator portion of the frequency converting stage, said first, second and third resonant circuits being provided in the receiver unit and each including capacitance means and variable permeability inductor means, first control means in the control unit for controlling said variable permeability inductor means in unison for tuning said resonant circuits, said capacitance means of said third resonant circuit having vernier tuner means including a semiconductor diode and capacitor means connected in series with said semiconductor diode, a direct current circuit connected to said semiconductor diode for supplying biasing potential thereto, said semiconductor diode controlling the capacitance value of said third resonant circuit in accordance with the biasing potential, and second control means adapted to be connected to the voltage source and connected to said direct current circuit for applying controlled voltage thereto, said second control means including a potentiometer mounted in the control unit and having a manual control element operable to vary the biasing potential applied to said semiconductor diode, said semiconductor diode being the only element of said third resonant circuit for varying the capacitance value of said third resonant circuit and providing remote vernier tuning of the receiver unit.

References Cited in the file of this patent

UNITED STATES PATENTS

| | | |
|---|---|---|
| 2,182,377 | Guanella | Dec. 5, 1939 |
| 2,581,202 | Post | Jan. 1, 1952 |
| 2,583,138 | Carter | Jan. 22, 1952 |
| 2,708,739 | Bucher | May 17, 1955 |
| 2,774,866 | Burger | Dec. 18, 1956 |
| 2,810,826 | Hargens | Oct. 22, 1957 |
| 2,853,680 | Nuut | Sept. 23, 1958 |
| 2,876,345 | Hartfield | Mar. 3, 1959 |
| 2,937,341 | Aram | May 17, 1960 |

OTHER REFERENCES

Article, "Remote Controls for TV" in "Radio-Electronics," Sept. 1956, pages 34–36.